United States Patent [19]
Labrum

[11] Patent Number: 4,712,059
[45] Date of Patent: Dec. 8, 1987

[54] BROADBAND OPTICAL PROCESSOR FOR DETERMINATION OF FREQUENCY AND TIME OF ARRIVAL OF MULTIPLE SIGNALS

[75] Inventor: Joseph H. Labrum, West Jordan, Utah

[73] Assignee: Sperry Corporation, Blue Bell, Pa.

[21] Appl. No.: 796,997

[22] Filed: Nov. 12, 1985

[51] Int. Cl.$^4$ ............................................. G01R 23/16
[52] U.S. Cl. .............................. 324/77 K; 350/162.14
[58] Field of Search ...................... 365/123, 124, 125; 455/611, 619; 350/358, 162.12, 162.13, 162.14; 324/77 K

[56] References Cited

U.S. PATENT DOCUMENTS

| | | | |
|---|---|---|---|
| 3,355,579 | 11/1967 | Robertson | 324/77 K |
| 4,389,093 | 6/1983 | Jackson | 350/162.14 |
| 4,503,388 | 3/1985 | Zehl et al. | 324/77 K |

*Primary Examiner*—Michael J. Tokar
*Attorney, Agent, or Firm*—G. Donald Weber, Jr.; Glenn W. Bowen; Laurence J. Marhoefer

[57] ABSTRACT

A real time, optical processor for the detection and separation of multiple frequency hop signals and which is capable of determining both the frequency and the time of arrival for all frequencies within a specified bandwidth.

14 Claims, 1 Drawing Figure

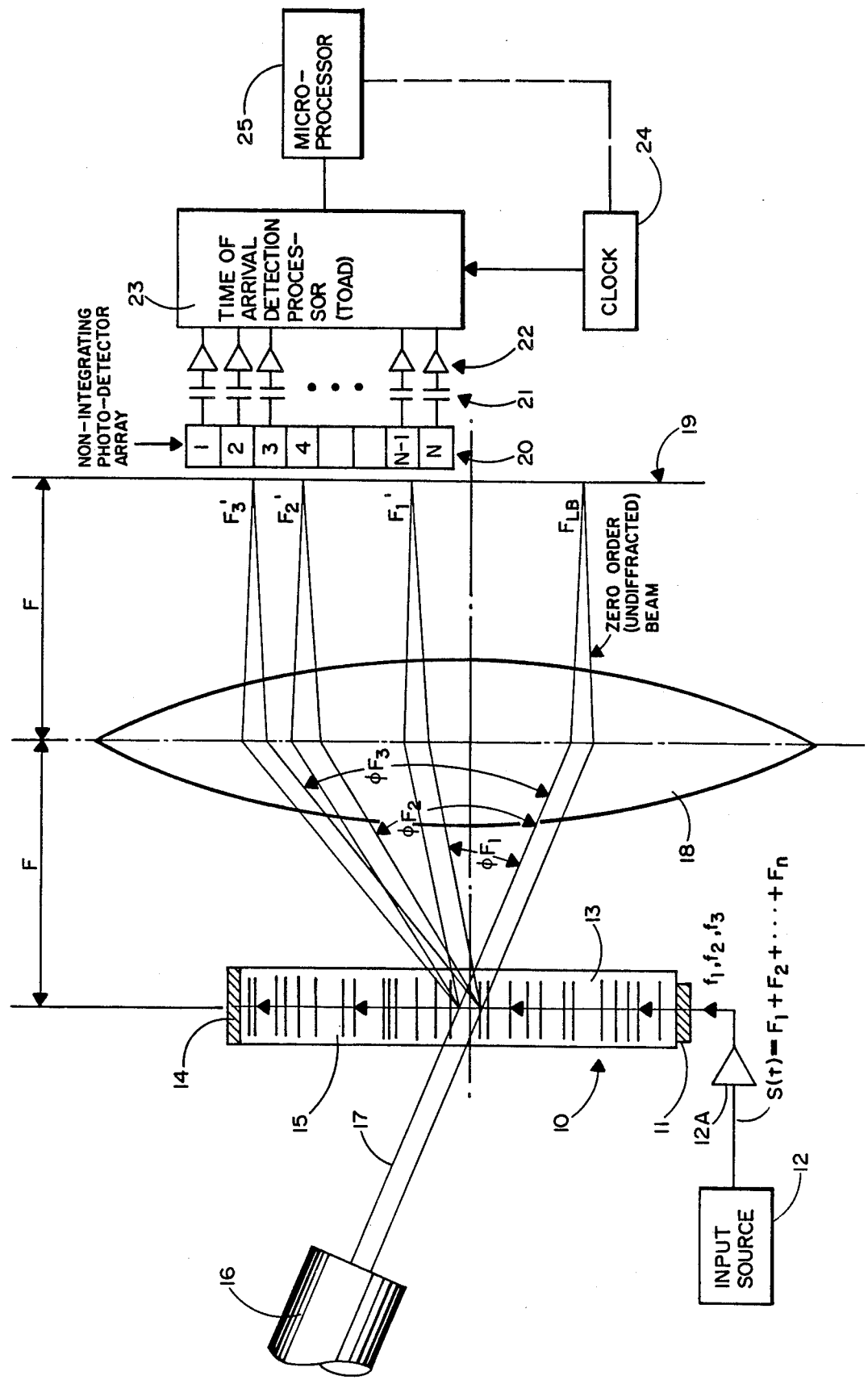

BROADBAND OPTICAL PROCESSOR FOR DETERMINATION OF FREQUENCY AND TIME OF ARRIVAL OF MULTIPLE SIGNALS

BACKGROUND

1. Field of the Invention

This invention is directed to optical spectrum analyzer devices, in general, and to an optical spectrum analyzer optical signal processor which includes a photodetector array for processing the time of arrival information, as well as the frequency, of multiple signals, in particular.

2. Prior Art

In many instances of signal detection, it is known to receive and analyze signals generated by another source and then use this detection as a means for tracking, identifying, locating and/or otherwise gathering information about the source. This information gathering can be done in terms of overt or covert activities. The signals from the sources can be encrypted or "in the clear" (i.e. uncoded). However, when the operations are covert, the signals are usually encrypted.

Moreover, in this type of situation which is used for various kinds of security reasons, one of the techniques which is used to thwart the would be detectors is to use frequency hopping. This is a well known technique wherein the signals from the source (whether coded or not) are generated at a first frequency for a period of time, switched to a different frequency for another period of time, switched to a third frequency for another period of time and so forth. This frequency switching may be and in a secure situation, typically, is on a random or pseudo-random basis (although the intended receiver knows and uses the same frequency hopping patern).

Obviously, the unintended detecting party will lose some information when the source begins the frequency hopping process. That is, the interceptor of the information will lock onto the first frequency and do whatever detecting techniques and operations are appropriate. However, when the sending party switches frequencies, the intercepting party will lose contact until it finds the new frequency on which the sending party is operating.

With sophisticated equipment, this frequency hopping can be detected and the information loss can be minimized. Consequently, the sending party is required to use its own highly sophisticated equipment to offset the intercepting party's capability. Frequently, this means that the sending party must use equally sophisticated techniques and/or equipment. One of the simplest techniques is to switch frequencies very quickly so that the intercepting party will not have sufficient time to re-establish contact in its intercepting and tracking operations. Moreover, even if the intercepting occurs fairly rapidly, a significant amount of information is lost during each of these re-acquisition periods.

In the past, the frequency hopping detection schemes have been provided in both the electronic and optical apparatus embodiments. Each of these technologies has advantages to recommend it. However, the instant discussion is limited to optical systems.

Optical signal processing equipment is well known in the art. Many of these optical processors are capable of handling broadband optical information.

To date, the known optical processing devices or systems are capable of detecting information which is related to the frequency hopping techniques described above. However, the known systems currently available are quite limited in the operations which they can perform. The known systems are limited both in terms of frequency response and the ability to analyze information concerning the exact time of arrival of the received signal.

Most of the known systems use conventional electronic equipment such as fast scanning, superheterodyne receivers; compressive receivers; and crystal detectors. However, these systems are still limited in the operating characteristics thereof.

Fast scanning superheterodyne receivers have good sensitivity as well as good bandwidth and frequency resolution but low probability of intercept and poor ability to determine time of arrival for frequency hop and/or pulse type emissions. Compressive receivers have good sensitivity, and reasonable bandwidth, but only a moderate probability of intercept, low frequency resolution and poor ability to determine time of arrival information. Crystal detectors have excellent bandwidth and high probability of intercept and the ability to determine time of arrival. However, they suffer from poor sensitivity, total inability to determine frequency, and cannot discern the arrival of simultaneous signals of different frequencies.

PRIOR ART STATEMENT

A review of the prior art has uncovered the following U.S. Patents which are referred to herewith.

U.S. Pat. No. 3,657,473; HOLOGRAPHIC IMAGE RECORDING AND REPRODUCING SYSTEM; J. W. Corcoran. This patent is directed to a holographic image recording and reproducing system for use with a conventional television receiver. The system includes a laser beam which is intensity modulated by being passed through a Bragg cell.

U.S Pat. No. 4,126,834; BULK WAVE BRAGG CELL; R. A. Coppock. This patent is directed to an acousto-optic bulk wave Bragg cell having a transparent piezoelectric body and a signle-layer, interdigital transducer signal input array on one surface thereof.

U.S. Pat. No. 4,531,196: REAL-TIME FOURIER TRANSFORMER USING ONE ACOUSTO-OPTICAL CELL; S. S. Lin. This patent is directed to an optical Fourier transformer comprising a laser which is modulated by the signal to be analyzed, a beam splitter for dividing the beam into two beams which are directed by optical means to opposite sides of a Bragg cell. The beams are recombined and directed to a time-integrating photo-detector array.

U.S. Pat. No. 4,531,197; REAL-TIME FOURIER TRANSFORMER USING ONE ACOUSTO-OPTICAL CELL; S. S. Lin. This patent is a modification of the preceeding patent wherein the two beams strike one side of the acousto-optic cell with opposite orientations.

SUMMARY OF THE INVENTION

This invention is directed to a broadband optical signal processor which is capable of determining the frequency and time of arrival of multiple input signals. In particular, this system uses optical apparatus which is, to a large degree, conventional and includes a Bragg-cell, a Fourier transform lens, a laser input and the like.

The system also uses a non-integrating pnotodetector array for receiving the signals, an appropriate differentiating and amplifying network and a suitable processor for detecting the signals produced by the other portions of the detector system.

A BRIEF DESCRIPTION OF THE DRAWINGS

The sole FIGURE is a schematic representation of the spectrum analyzer of the instant invention.

DESCRIPTION OF A PREFERRED EMBODIMENT

Referring now to the FIGURE, there is shown a schematic representation of the spectrum analyzer of the instant invention. In particular, the invention includes an acousto-optic cell 10. Such cells are frequently referred to as Bragg-cells. The cell of this invention is conventional and includes therein acoustic and light transmitting material 15. At the input end of cell 10 is transducer 11 which is affixed to the cell so as to generate acoustic waves 13 in the material 15 in response to input signals from the signal source 12 and amplifier 12A. The source 12 may be an antenna or any other suitable source for providing signals to the cell 10. The other end of the Bragg-cell 10 includes an acoustic absorbing material 14 which prevents reflections of the acoustic waves travelling through the cell.

Located adjacent to one side of cell 10 is a suitable light source such as a laser 16 which produces a laser input beam 17. The laser beam 17 is directed at and through the cell 10. In accordance with the frequency of the signal supplied by the laser 16 and the transmission diffraction grating which is established by passing the acoustic waves 13 through Bragg-cell 10, the laser beam 17 is diffracted into a plurality of output beams which are described hereinafter.

These output beams are directed at and through a Fourier transform lens 18. The beams, after passing through lens 18, are caused to focus at the focal plane F of lens 18 at a location referred to as the Fourier transform plane 19.

Located at the plane 19 is non-integrating photodetector array 20. This array includes a plurality of N photodetector devices. Each of the photodetector devices is connected to a separate differentiating capacitor 21. Each of the capacitors 21 is connected to the input of a separate amplifier 22. The outputs of each of the amplifiers 22 are connected to a detection processor 23 which is used to detect the time of arrival of each signal thereat. A clock source 24 is connected to the detector 23 to provide clock signals to selectively activate this detector. A microprocessor 25 is connected to the outputs of the detector 23 to operate on the signals produced by the processor in accordance with any suitable algorithm or process control mechanism desired.

It should be noted that the clock source 24 can be connected to both the detector 23 and the microprocessor 25. Conversely, the clock signal can be provided directly by the microprocessor 25 in order to synchronize the operations of these devices.

In typical operation, the laser 16 is disposed at an angle to the plane of the cell 10. Typically, this angle is something less than a right angle so that the laser beam 17 strikes the cell 10 at other than a perpendicular angle. The angle is chosen to make the operation of the circuit optically more efficient and is usually referred to as the Bragg angle. In the event that there is no signal at the input source 12, the laser beam 17 passes directly through the cell and strikes lens 18 whereupon it is focused at the Fourier transform plane 19 as the zero order or undiffracted beam. This beam has a frequency $F_{LB}$ which is the same as the laser input beam.

When an input signal is supplied to cell 10 at input transducer, a diffraction grating is produced as a result of the acoustic waves 13 which pass through the cell. This diffraction grating causes the laser input beam 17 to be diffracted into a number of beams which are a function of the frequencies contained in the input signal. These signals are redirected to the transform lens 18 whence they are focused at the transform plane 19. As noted, each of these frequency signals is representative of a separate, different and distinct input frequency. For example, if the symbol $F_1'0$ represents the signal 10.2 megaherz, the application of a 10.2 MHz signal at the input signal source 12 will always produce a beam $F_1'$ at the same location on the Fourier transform plane 19.

Thus, it is seen that a plurality of light beams are created and formed at the transform plane 19.

Through the use of an appropriate pnotodetector array, a plurality of photodetector devices 1, 2, 3, ... N is disposed at the Fourier transform plane 19 to receive the separate signals produced at the Fourier transform plane. The arrangement between the array and the focused beams is also fixed. Thus, if the beam $F_2'$ is directed at the photodetector #4, then photodetector #4 and only photodetector #4 will be activated by the beam $F_2'$ and only that beam. In other words, photodetector #4 cannot be activated by the beam $F_3'$ nor can the beam $F_3'$ activate photodetector #4. This same requirement exists for all of the detectors and all of the beams.

When any photodetector is activated, it provides an output signal which is supplied to the associated differentiating capacitor 21. This capacitor, in conjuction with the impedance of the amplifier 22, operates to differentiate the signal supplied thereto from the related photodetector. Thus, when a beam is applied to a photodetector, the detector is activated and produces a signal. This signal can be considered to be in the nature of a pulse. However, the differentiating circuit operates to produce the signal only upon the transition (e.g., leading edge or trailing edge) of the pulse generated by the photodetector. Consequently, the application of a beam to a photodetector does not produce not a steady state DC output. Rather, a spike or peak pulse is passed through the capacitor to the amplifier when the beam first occurs. The amplifier operates to amplify this signal to the extent necessary or desired and to supply same to the time of arrival detector (TOAD) processor circuit 23. This circuit, in accordance with any appropriate algorithm therein, records the fact of the arrival of the signal as well as the frequency (location on the photodetector array) of the arriving signal. Thus, the time of arrival and the frequency of the signal are determined. Likewise, the TOAD processor 23 is capable of making the same detection and calculation and/or analysis of any and all signals which arrive from the photodetector array 20. Consequently, any number of signals supplied to the detector can be analyzed. In otherwords, if a plurality of signals are applied to the photodetector, the plurality of signals are detected at the TOAD processor 23. Thus, if the signal S(t) at source 12 comprises one or more frequencies, a like number of beams are generated at the transform plane 19 and all of these signals are detected by the photodetector. The detector produces the appropriate spike pulse(s) which is then amplified and operated upon by the TOAD processor 23.

Upon the termination of a particular frequency, at the input signal, the pertinent beam is also terminated so that the representative beam is no longer applied to the photodetector array 20. With this termination, the detector turns off and, through the differentiating network, produces a negative going spike which can be used by the system. It is, of course possible that this information would not be of any consequence and could be rejected or clamped, if so desired. However, the signal information is available, if desired and can be useful in the separation of simultaneous frequency hop signals.

It should be apparent that a further advantage is obtained with the use of the differentiating network. That is, if a second source is encountered which causes the same frequency to be detected, the photodetector would produce another spike pulse indicative of the application of another light pulse thereto. This second spike beam would be operated upon by the remainder of the signal detector, the microprocessor and so forth to convey the multiple input condition. Of course, this operation would require that the photodetector array be at least somewhat intensity sensitive.

As noted, the microprocessor 25 is connected to the TOAD processor 23. The microprocessor is capable of receiving information from the TOAD processor 23 and, in accordance with any internal control algorithms or the like, make whatever use or operation as desired on these signals. For example, the microprocessor could keep track of the time of arrival, and the frequency of the signal. As noted, the frequency of the signal is detected by knowing the address of the photodetector 20 which is, of course, a sample of the type of information which could be stored within the microprocessor 25.

Thus, there is shown and described and optical processor system that performs frequency and time of arrival processing of a signal in real time. By using a non-integrating detector at the output thereof, the optical processor is arranged to provide a time of arrival detector which is capable of detecting individual and multiple signals up to "N" (where N is the number of photodetector elements) independent signals simultaneously. When a specified signal is supplied to the Bragg-cell, the related beam is instantaneously generated at the Fourier transfer plane whereupon the photodetector produces a signal which is differentiated by the coupling capacitor, amplified by the buffer amplifier, and fed into the time of arrival detection processor. From this operation, the exact time of arrival of the specific beam (and the related frequency) is known as well as the frequency of the signal which caused the beam to be generated. These two bits of information are passed to a microprocessor for separation of frequency hop signals by time of arrival.

In the typical application, the limit on accuracy of the system is determined by the speed of the clock from the microprocessor and the length of time required for the intensity of the individual signal beams to rise and fall. The clock rate can easily be in the order of 10 MHz to 100 MHz. Consequently, this limit can be of relatively no consequence in the detection of frequency hop signals in the range of several 10's of KHz. The rise and fall time of the beam intensity is related to the aperture time for the Bragg-cell. By using the appropriate Bragg-cell, this limitation can be optimized.

The instant description is intended to present a preferred embodiment of the invention. Modifications to this invention can, of course, be provided. For example, wile the laser is the preferred light source, other light sources may be used. The type of laser is subject to design preference. Other alternative arrangements or operations are suggested in the description. The description is, therefore, intended to be illustrative only and is not intended to be limitative. Rather, the scope of the invention is limited only by the scope of the claims appended hereto.

I claim:
1. An optical signal processor comprising,
light source means,
an acousto-optic cell disposed to receive and selectively transmit light beams from said light source means,
signal source means connected to said acousto-optic cell to generate acoustic waves through said acousto-optic cell transverse to said light beam in order to affect the transmission of light beams through said acousto-optic cell,
a Fourier transform lens adjacent to said acousto-optic cell to focus the light beams transmitted by said acousto-optic cell,
a photodetector array means disposed at the Fourier transform focal plane of said lens and operative to produce electrical signals in response to receipt of light beams,
differentiating means connected to said photodetector array means and operative to differentiate said electrical signals produced by said photodetector array means, and
a time of arrival processing system connected to receive signals from said array means via said differentiating means and to process the signals in the order of arrival.
2. The processor recited in claim 1 wherein,
said acousto-optic cell comprises a Bragg-cell.
3. The processor recited in claim 1 wherein,
said differentiating means comprises capacitor means.
4. The processor recited in claim 1 including,
amplifier means connected between said differentiating means and said time of arrival processing system.
5. The processor recited in claim 1 wherein,
said array means comprises a non-integrating photodetector array.
6. The processor recited in claim 1 including,
clock means for controlling the timing operation of said time of arrival processing system.
7. The processor recited in claim 6 including,
microprocessor means connected to said time of arrival processing system for storing and operating upon time of arrival information with regard to the signals supplied to said time of arrival processing system.
8. The processor recited in claim 7 wherein,
said microprocessor means and said time of arrival detector system are connected to said clock means.
9. The processor recited in claim 1 wherein,
said light source means comprises a laser.
10. The processor recited in claim 1 wherein,
said signal source means comprises antenna means.
11. The processor recited in claim 1 wherein,
said acousto-optic cell includes transducer means for receiving signals from said signal source means and producing acoustic waves in said acousto-optic cell thereby to produce a transmission diffraction grating.
12. The processor recited in claim 5 wherein, said photodetector array means comprises a plurality of independent photodetector devices, said differentiating means comprises a plurality of differentiaters individually connected to respective photodetector devices.

13. The processor recited in claim 1 including, frequency detection means operative to detect the frequency of the signals supplied to said time of arrival processing system from said differentiating means.

14. The processor recited in claim 1 wherein, said time of arrival processing system is operative to process a plurality of signals supplied thereto simultaneously.

* * * * *

UNITED STATES PATENT AND TRADEMARK OFFICE
CERTIFICATE OF CORRECTION

PATENT NO.   :   4,712,059
DATED        :   December 8, 1987
INVENTOR(S)  :   Joseph H. Labrum It is certified that error appears in the above-identified patent and that said Letters Patent are hereby corrected as shown below:

Column 1, line 10, after "lyzer" insert -- (or --, and after "processor" insert -- ) -- .

Column 4, line 4, after "transducer" insert -- 11 -- .

Column 4, line 14, change "megaherz" to -- megahertz -- .

Signed and Sealed this

Nineteenth Day of April, 1988

Attest:

DONALD J. QUIGG

*Attesting Officer*     *Commissioner of Patents and Trademarks*